(12) United States Patent
Plainchamp et al.

(10) Patent No.: US 9,933,703 B2
(45) Date of Patent: Apr. 3, 2018

(54) PHOTOLITHOGRAPHIC ILLUMINATOR DEVICE ENABLING CONTROLLED DIFFRACTION

(71) Applicants: SAGEM DEFENSE SECURITE, Boulogne-Billancourt (FR); SHANGHAI MICRO ELECTRONICS EQUIPMENT CO., LTD., Shanghai (CN)

(72) Inventors: Bertrand Plainchamp, Boulogne-Billancourt (FR); Renaud Mercier Ythier, Boulogne-Billancourt (FR)

(73) Assignees: SAGEM DEFENSE SECURITE, Boulogne-Billancourt (FR); SHANGHAI MICRO ELECTRONICS EQUIPMENT CO., LTD., Shanghai (CN)

( * ) Notice: Subject to any disclaimer, the term of this patent is extended or adjusted under 35 U.S.C. 154(b) by 15 days.

(21) Appl. No.: 14/430,896

(22) PCT Filed: Sep. 25, 2013

(86) PCT No.: PCT/EP2013/069984
§ 371 (c)(1),
(2) Date: Mar. 24, 2015

(87) PCT Pub. No.: WO2014/049001
PCT Pub. Date: Apr. 3, 2014

(65) Prior Publication Data
US 2015/0248063 A1 Sep. 3, 2015

(30) Foreign Application Priority Data
Sep. 25, 2012 (FR) ..................................... 12 59004

(51) Int. Cl.
*G03B 27/72* (2006.01)
*G03F 7/20* (2006.01)
*G02B 27/09* (2006.01)

(52) U.S. Cl.
CPC ..... *G03F 7/70075* (2013.01); *G02B 27/0927* (2013.01); *G02B 27/0961* (2013.01); *G03F 7/70066* (2013.01)

(58) Field of Classification Search
CPC ............ G02B 27/0927; G02B 27/0961; G03F 7/70066; G03F 7/70075
See application file for complete search history.

(56) References Cited

U.S. PATENT DOCUMENTS

| 4,497,015 A | * | 1/1985 | Konno | ................ G03F 7/70075 353/38 |
| 5,130,213 A | * | 7/1992 | Berger | .................. B82Y 10/00 250/492.2 |

(Continued)

FOREIGN PATENT DOCUMENTS

| CN | 101 587 302 B | 10/2011 |
| WO | WO-2011/039261 A2 | 4/2011 |

*Primary Examiner* — Deoram Persaud
(74) *Attorney, Agent, or Firm* — Womble Bond Dickinson (US) LLP

(57) ABSTRACT

The invention relates to a photolithographic illuminator device including: a light beam source, a condenser (5), an optical homogenizing system (4) including at least one microlens array, said system being arranged upstream from the condenser, and a shutter (3) arranged at the object focal point of the optical homogenizing system, the illuminator being characterized in that same further comprises a network of aperture diaphragms (8) arranged in the Fourier transform plane of the shutter plane (3). The invention likewise relates to a photolithographic device including such an illuminator.

9 Claims, 6 Drawing Sheets

(56) References Cited

U.S. PATENT DOCUMENTS

| | | | | |
|---|---|---|---|---|
| 6,597,430 B1* | 7/2003 | Nishi | ............... | G03F 7/70583 355/53 |
| 2003/0073009 A1* | 4/2003 | Nakao | ............... | G03F 7/70641 430/5 |
| 2003/0170552 A1* | 9/2003 | Miyashita | ............ | G03F 7/70058 430/30 |
| 2004/0223330 A1* | 11/2004 | Broude | ............... | G02B 27/09 362/268 |
| 2005/0094997 A1* | 5/2005 | Orino | ............... | G03F 7/70183 398/9 |
| 2005/0213068 A1 | 9/2005 | Ishii | | |
| 2007/0052953 A1* | 3/2007 | Hill | ............... | G01N 21/4738 356/237.2 |
| 2007/0229957 A1* | 10/2007 | Sogard | ............... | G02B 1/10 359/584 |
| 2008/0013182 A1* | 1/2008 | Ferber | ............... | B23K 26/0648 359/619 |
| 2008/0151206 A1* | 6/2008 | Baselmans | ............ | G03F 7/70075 355/53 |
| 2009/0231718 A1* | 9/2009 | Muenz | ............... | B23K 26/0604 359/626 |
| 2009/0257041 A1* | 10/2009 | Boutonne | ............ | G03F 7/70066 355/71 |
| 2011/0122385 A1* | 5/2011 | Claessens | ............ | G02B 27/0905 355/67 |
| 2011/0300490 A1* | 12/2011 | Rachet | ............... | G02B 21/0032 430/322 |
| 2015/0234288 A1* | 8/2015 | Plainchamp | ............ | G03F 7/7015 355/67 |

\* cited by examiner

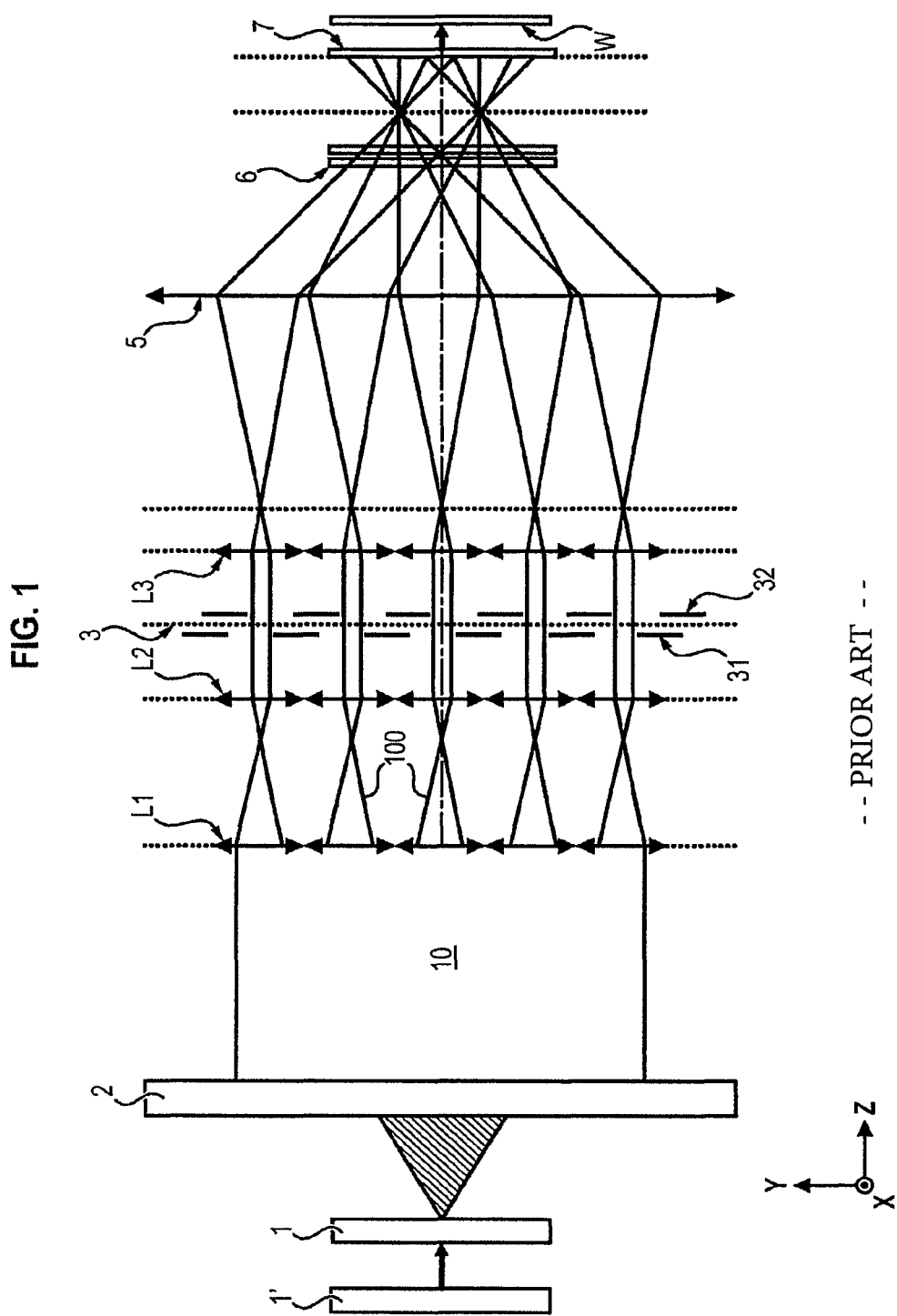

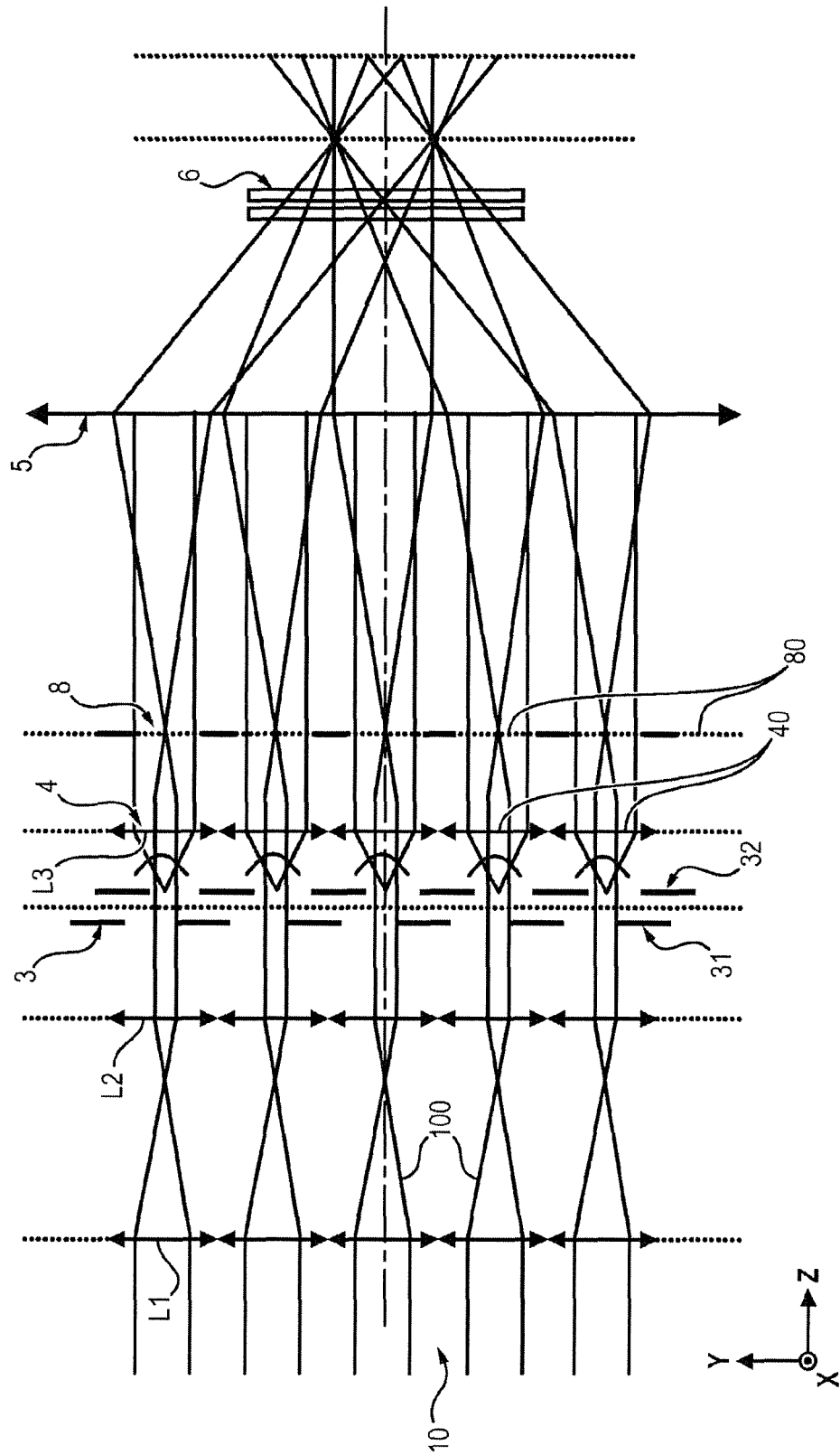

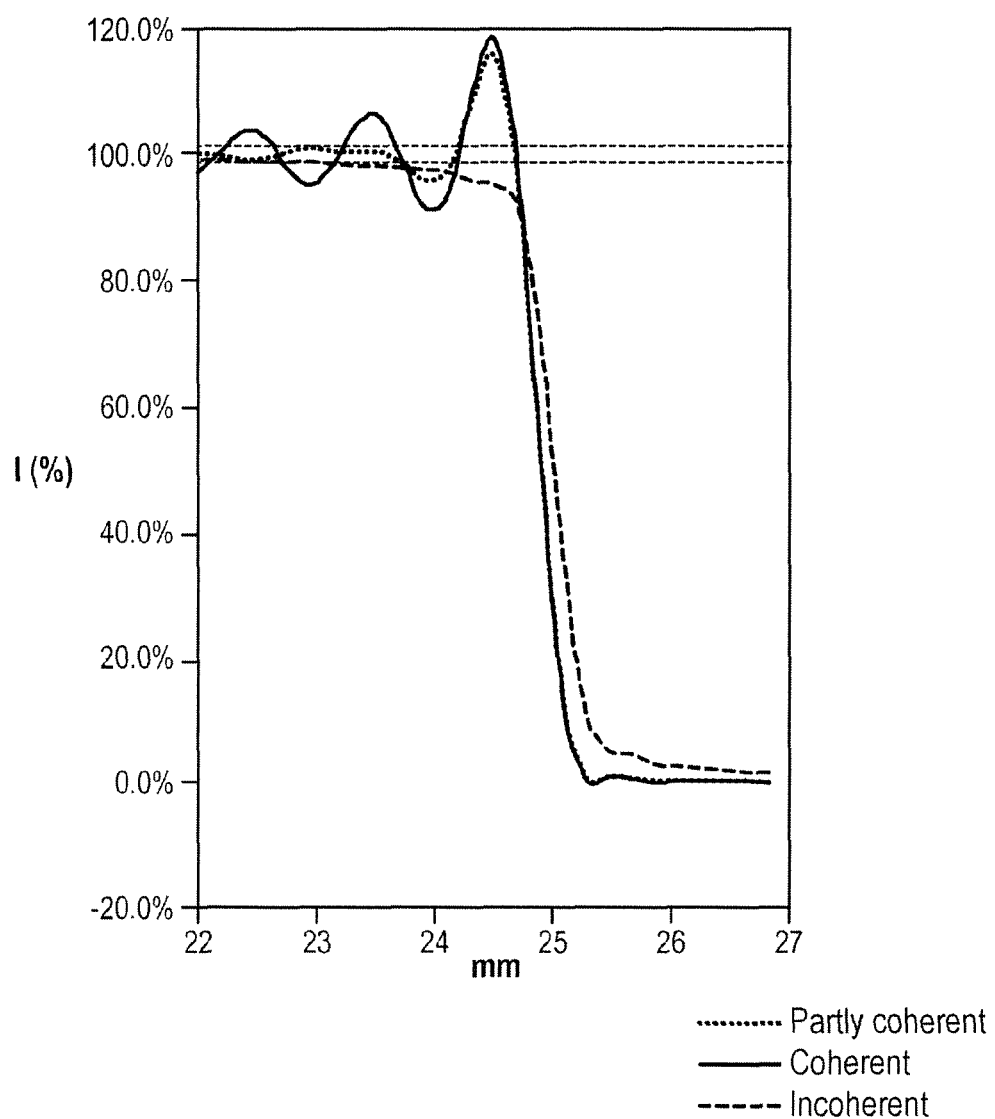

PHOTOLITHOGRAPHIC ILLUMINATOR DEVICE ENABLING CONTROLLED DIFFRACTION

TECHNICAL FIELD OF THE INVENTION

The present invention relates to an illuminator of a photolithographic device, and to such a photolithographic device.

STATE OF THE ART

Photolithography is a technique used for making semiconducting devices, by using electromagnetic radiation for generating thin patterns on semiconducting devices. For this purpose, an illuminator of a photolithographic device illuminates a mask, the image of which is projected on a semiconducting slice (also known as "wafer").

With reference to FIG. 1, a known illuminator generally includes a diffractive optical element (also called a DOE) which is illuminated by an illumination source 1'.

The illumination source 1' is a laser source for example.

The element 1 may be any element generally used for producing diffraction, such as for example a two-dimensional array of spherical microlenses, a Fresnel lens, a diffraction grating, etc. The element plays the role of an optical scattering device and has the main function of producing at its output a pupil with a generally desired pattern, for example disk- or ring-shaped.

The illuminator includes at the output of the element 1 a zoom 2 formed with several lenses. The function of the zoom 2 is to bring back the image of the outlet pupil of the element 1 to a finite distance and to be able to vary it in dimension.

At the outlet of the zoom 2, an array L1 of microlenses is positioned, consisting of a flat plate comprising two faces facing each other, and a network of spherical or cylindrical microlenses being formed on each face. The array L1 of microlenses splits the incident beam, at the outlet of the zoom 2, into a multitude of sub-beams. In other words the outlet pupil of the array L1 is decomposed into outlet sub-pupils.

A second array L2 of microlenses is positioned downstream from the first one L1 so that the L1L2 system is afocal.

A third array L3 of microlenses is positioned downstream from the second one L2. At the image focus point of this third array L3, an obturator 3 is positioned, consisting of a plate or a grid on which apertures are made at regular intervals. Alternatively, the obturator 3 may comprise two plates 31, 32 moved in synchronism with the movements of the mask 7 and of the wafer w to be illuminated along a direction orthogonal to the optical axis, or directions orthogonal to the optical axis and if necessary to each other. Reference may be made to document WO2007/028793 for more details on the making of this obturator.

In every case, the obturator 3 gives the possibility of controlling the dose, the image format and the illumination profile on the mask 7. In this respect, it is positioned in a plane conjugate with the focal plane of a condenser 5, the mask 7 being slightly positioned downstream from the latter. This gives the possibility of preventing light from being transmitted outside the desired field, generating parasitic light on the wafer being illuminated. The fact that the mask is slightly defocused relatively to the focal plane of the condenser allows improvement in the control of the dose by smoothing out time variations of energies of the light pulses.

The fact that the L1L2 network system upstream from the obturator 3 is afocal, allows limitation of the size of the outlet sub-pupils of the system illuminating the obturator. Thus there exists a non-illuminated area, located between the microlenses of the beams, wherein the opaque portion of the obturator 3 may be positioned without intercepting the beam when the image field has to be completely illuminated. This allows a sharp cutoff of the sub-beams at the outlet of the obturator and sharp obturation at the mask.

The image focal point of the third array L3 of microlenses is located in the object focal point of a condenser 5, in order to make the illuminator telecentric, i.e. so that the outlet pupil of the illuminator is at infinity. The condenser 5, as for it, includes a plurality of lenses with which the sub-beams from the L1L2 arrays may be superposed at the mask.

An apodization device 6 is also placed between the condenser 5 and the mask 7.

As indicated earlier, the obturator 3 is positioned in a conjugate plane of the focal plane of the condenser in order to ensure sharp obturation of the light beam 10.

Such an illuminator notably provides good results for the light beam along one dimension, i.e. when the obturation of the light beam has to be ensured along a first axis in the plane of the obturator.

However, under the assumption that the obturation has to be ensured along two axes of the plane of the obturator, notably two axes perpendicular to the optical axis and perpendicular to each other, imaging problems are posed.

Indeed, the telecentricity condition of the illuminator imposes that the obturator 3 be positioned in the object focal point of the array of microlenses L3 in the directions of both obturation axes. On the other hand, the image sharpness condition of the obturator on the mask imposes that the image focal point of the array of microlenses L3 be positioned in the object focal points of the condenser in both directions.

Both of these conditions impose that the array of microlenses L3 should have the same focal distance along both directions. Now, in this type of illuminator, as the focal distance of the microlenses is of the same order of magnitude as the thickness of said microlenses, it is geometrically impossible to ensure that this result is obtained, and therefore guarantee a perfect combination between the obturator and the mask in both directions.

On the other hand, the obturator causes a diffraction phenomenon which makes it difficult to obtain a sharp image of the obturator in the plane of the condenser, and therefore on the mask. More particularly, diffraction of light by the grid scatters the light beam, according to a greater aperture than the aperture of the sub-beams stemming from the arrays of microlenses L1L2. Two negative consequences result from this:

if diffraction is too large, the light from the obturator may not pass through the right microlens of the array L3, generating crosstalk between the sub-beams 100 and interference phenomena on the mask.

diffraction by the obturator leads to an increase in the aperture of the sub-beams at the input of the third array L3 of microlenses. Now, a larger aperture limits the object field depth of the array of microlenses L3, which increases the sensitivity to defocusing of the obturator with respect to the object focal plane of this array L3. The adjustment of the illuminator is therefore made more complicated.

PRESENTATION OF THE INVENTION

The invention proposes to overcome at least one of the problems above.

For this purpose, an illuminator of a photolithographic device is proposed, comprising:
- a source of a light beam,
- a condenser,
- an optical homogenizing system, comprising at least one array of microlenses, said system being positioned upstream from the condenser, and
- an obturator, positioned in the object focus of the optical homogenizing system, the illuminator further including a network of aperture diaphragms, positioned in the Fourier transform plane, or Fourier plane, of the plane of the obturator.

Advantageously, but optionally, the invention is further completed with at least one of the following features:
- the network of aperture diaphragms includes a plurality of diaphragms positioned facing the microlenses of an array of the optical homogenizing system, each diaphragm of the diaphragm network being positioned facing a corresponding microlens,
- the focal distance $f_1$ of a first array of microlenses of the optical homogenizing system with respect to the direction of the optical axis, the illumination angle θ of the obturator, and the aperture diameter b of the diaphragms are adapted so that the light rays passing through the diaphragms have a coherence factor $$\sigma = \frac{2f_1 \sin(\theta)}{b}$$

comprised between 0.2 and 0.8,
- the aperture diameters of the diaphragms and the coherence factors of the light rays passing through said diaphragms vary from one diaphragm to the other,
- the aperture diameters of the diaphragms and the coherence factors of the light rays are variable between two adjacent diaphragms,
- the distribution of the aperture diameters is random,
- the variations of the aperture diameters from one diaphragm to the other are comprised between 0 and 50%, and preferably between 0 and 30%,
- the image focal plane of the optical homogenizing system is positioned in the object focal plane of the condenser.

The object of the invention further relates to a photolithographic device, including a mask and an illuminator according to the invention, in which the obturator of the illuminator is positioned in a conjugate plane of the image focal plane of the condenser.

The invention has many advantages.

An illuminator according to the invention fulfills the combination conditions between the obturator and the mask to be illuminated both in a first direction orthogonal to the optical axis, but also in a second direction orthogonal to the optical axis, and preferably orthogonal to the first direction.

Further, an illuminator according to the invention gives the possibility of controlling the diffraction effect related to the obturator so as to increase the sharpness of the image of the obturator on the mask. By controlling the aperture, it is further possible to make the third array of microlenses L3 less sensitive to defocusing of the grid with respect to its object focal plane, which facilitates the mounting and adjustment of the illuminator according to the invention.

PRESENTATION OF THE FIGURES

Other features, objects and advantages of the invention will become apparent from the description which follows, which is purely illustrative and non-limiting, and which should be read with reference to the appended drawings wherein:

FIG. 1, already described, schematically illustrates an illuminator known from the state of the art;

FIGS. 2a, 2b and 2c schematically illustrate different embodiments of an illuminator according to the invention;

FIG. 4 illustrates the image of a slot of the obturator in the object focal plane of the condenser depending on the coherence of light beams crossing a diaphragm network.

DETAILED DESCRIPTION OF AT LEAST ONE EMBODIMENT OF THE INVENTION

General Description of the Illuminator

Figure 2A:
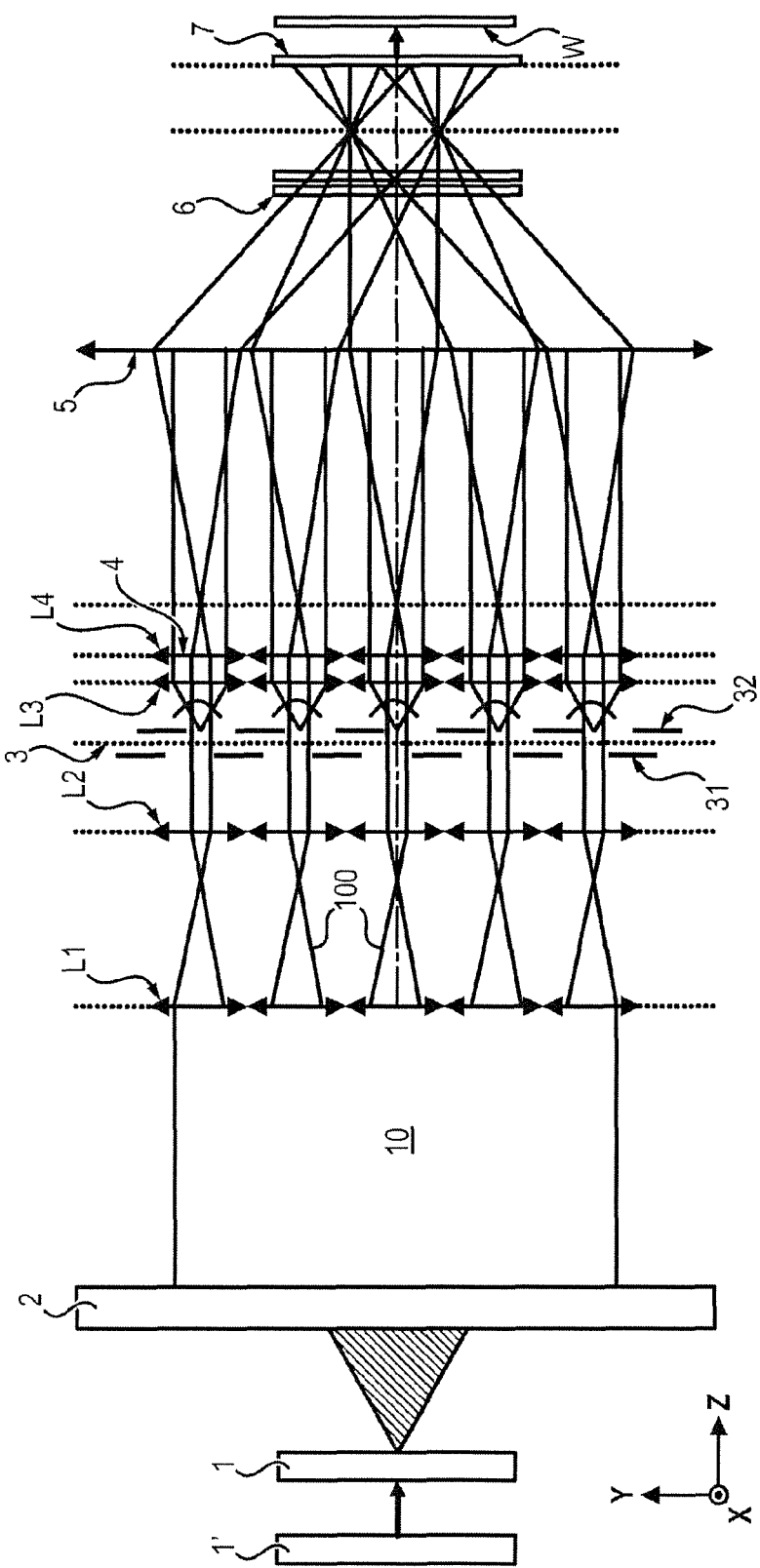
Figure 2C:
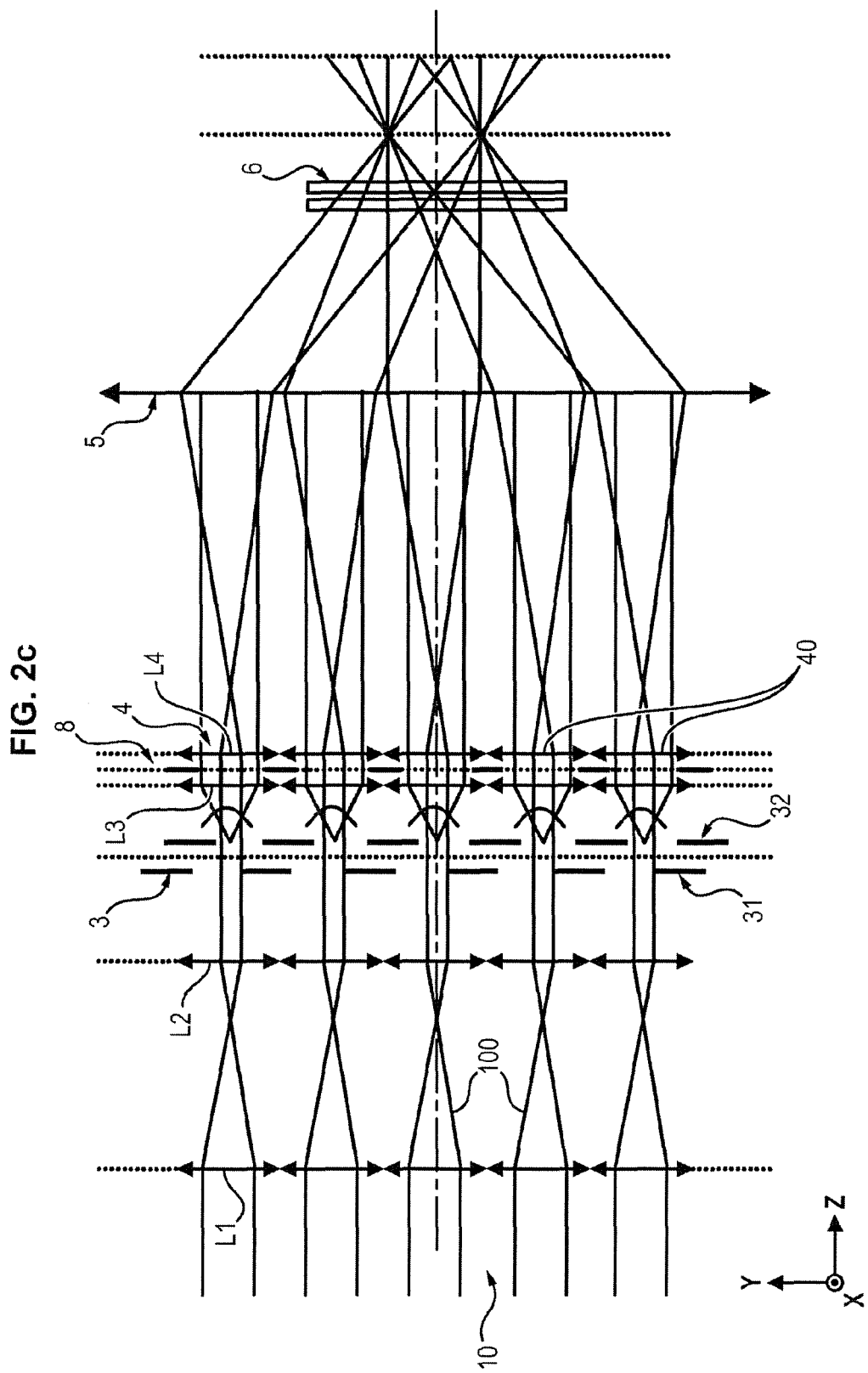

FIGS. 2a to 2c schematically show a portion of an illuminator according to the invention.

In FIG. 2a, the illuminator includes a source 1' of a light beam 10, for example a laser source, a diffractive element 1 placed at the outlet of the source 1', and a zoom 2 (these elements are not shown in FIGS. 2b and 2c).

It further includes an afocal system L1L2 consisting of a first and second array of microlenses L1 and L2 at the outlet of the zoom 2.

The beam 10 comprises at the outlet of the afocal system L1L2, a plurality of sub-beams 100, forming outlet sub-pupils of the afocal system L1L2.

The illuminator includes an obturator 3, illustrated as two grids 31, 32, and positioned at the outlet pupils of the afocal system L1L2.

An optical homogenizing system 4 including a third array L3 of microlenses is placed downstream from the obturator 3, so that the latter is positioned in the object focal plane of the optical homogenizing system 4.

The illuminator also includes a condenser 5 with which it is possible to superpose to a photolithographic mask 7 the sub-beams 100 from the afocal system L1L2, an apodization device 6 being provided between the condenser 4 and the plane in which the mask 7 is positioned.

The object focal plane of the condenser 5 is advantageously positioned in the image focal plane of the homogenizing system 4 in order to ensure the sharpness of the image of the obturator on the mask.

A photolithographic device comprising such an illuminator also comprises a mask 7 positioned on a wafer w to be etched, the obturator being positioned in the conjugate plane of the image focal plane of the condenser 5, it being understood that during use, projection optics produce the image of the mask 7 on the wafer w.

Homogenizing System

The homogenizing system of the illuminator according to the invention gives the possibility of obtaining the sharpness and telecentricity of the illuminator in two distinct directions, orthogonal to the optical axis. These directions are advantageously orthogonal to each other. As a non-limiting example, in FIGS. 2a to 2c, the optical axis is noted as Z, an axis along a first direction orthogonal to the optical axis and orthogonal to the sectional plane of the figures is noted as X, and an axis along a second direction orthogonal to the optical axis and to the X axis is noted as Y.

The homogenizing system allowing this result to be obtained, in addition to the third array of microlenses L3, comprises a fourth array of microlenses L4.

Figure 3:
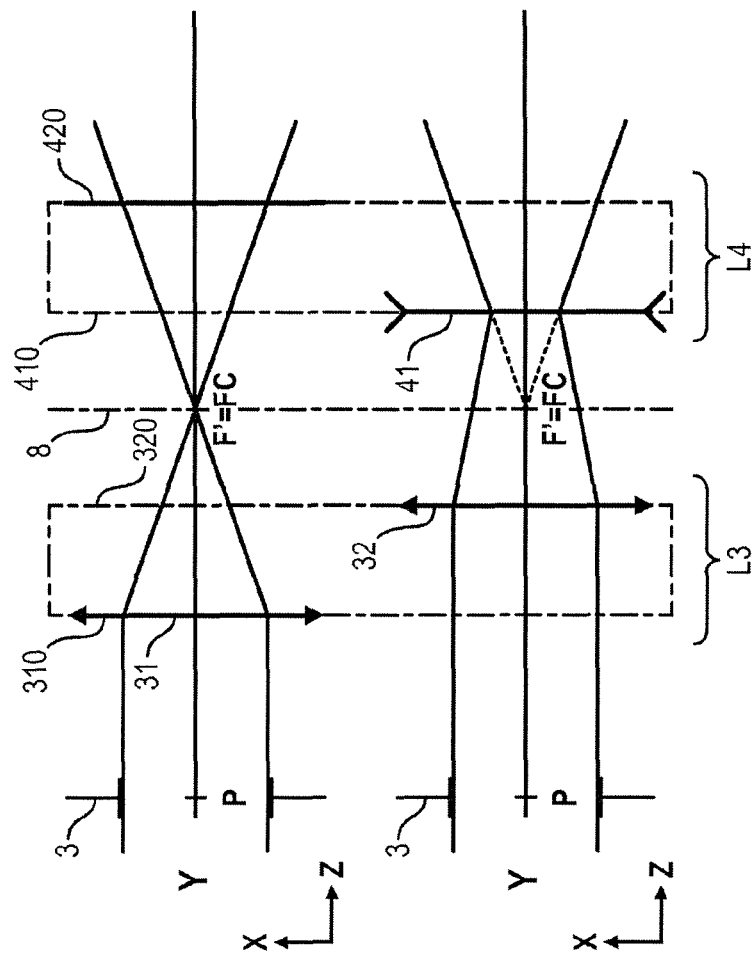
FIG. 3 illustrates the arrangements relative to the arrays of microlenses downstream from the obturator.

The relative configurations of the arrays of microlenses L3 and L4 are illustrated in FIG. 3. The obturator 3, located at the object focal point P of the homogenizing system, and the image focal plane F' of this system, which have to be located in the object focal plane FC of the condenser, in both directions X and Y, are schematically illustrated.

Sharpness and telecentricity conditions are ensured if the optical homogenizing system has the same object and image focal planes in both directions X and Y.

To do this, each array of microlenses appears as a planar plate comprising two faces 310, 320, 410, 420 facing each other, a plurality of cylindrical microlenses being etched on at least one of said faces.

More specifically, the array of microlenses L3 includes microlenses on each of its faces 310, 320, the microlenses being cylindrical, the axes of the microlenses of one face being orthogonal to the axes of the microlenses of the other face.

The axes of the microlenses of both faces are orthogonal to the optical axis so that light rays reach the microlenses through their cylindrical surfaces.

As for the array of microlenses L4, it only includes cylindrical microlenses on its first face 410 relatively to the propagation direction of the light flux, the upper face 420 being planar so as not to divert the light rays in any direction.

The axes of the cylinders of the microlenses are oriented so that, in a first direction, for example the Y direction, the homogenizing system behaves as a convergent lens 31 positioned at the first face of the array L3. The plane of the obturator P is then in the object focal plane of said lens 31, and the object focal plane of the condenser FC is in the image focal plane F' of said lens.

In order to obtain this result, the axes of the cylindrical lenses of the first face of the array of microlenses L3 extend orthogonally to the Y direction, while the axes of the other cylindrical lenses (i.e. those of the second face of the array L3 and of the first face of the array L4) extend parallel to the Y direction, so as not to deviate the propagation of the light beams along the Y direction.

This gives the possibility of obtaining the sharpness and the telecentricity of the illuminator in the first direction Y.

As for the second direction, in this case the X direction, the axes of the cylinders of the microlenses are oriented parallel to the first direction Y, so that the homogenizing system 4 behaves as a system comprising:
  a convergent lens 32 at the second face of the array L3, and
  a divergent lens D1 at the first face of the array L4,
the plane of the obturator being in the object focal plane of the convergent lens 32, and the object focal plane of the condenser being in the image focal plane F' of the system.

The lenses are dimensioned in a way known to one skilled in the art so that their respective focal lengths allow such a result to be obtained.

Thus, the positioning of both arrays of microlenses L3 and L4, and the dimensioning of the lenses making them up, give the possibility of obtaining a homogenizing system 4 having the same focal length in both directions.

Diaphragms

Referring to FIG. 2b, the illuminator comprises, in order to control diffraction phenomena at the outlet of the obturator, a network 8 of aperture diaphragms, positioned in the plane of the Fourier transform, or Fourier plane, of the plane P of the obturator.

Preferably, this network comprises a plurality of diaphragms 80, each diaphragm 80 being positioned facing a corresponding microlens 40 of an array adjacent to the homogenizing system.

In FIG. 2b, the homogenizing system 4 comprises only one array L3 of microlenses; the diaphragm network is then found in the image focal plane of the array L3 of microlenses, the diaphragms facing the microlenses of this array L3.

In FIG. 2c, the use of a network 8 of diaphragms was combined with a homogenizing system 4 comprising two arrays of microlenses L3 L4 as described earlier with reference to FIG. 2a.

In this case, the diaphragm network 8 is positioned between both arrays of microlenses L3 and L4, in the plane of F', this plane being the Fourier plane of the plane of the obturator. The diaphragms are found facing the microlenses of the arrays L4 and L3 of microlenses.

Thus, in the case of diffraction at the outlet of the obturator 3, the presence of diaphragms gives the possibility of avoiding crosstalk phenomena between the sub-beams 100 of the light beam. With the network 8 of diaphragms, it is also possible to sufficiently increase the field depth so as to make the accuracy of the illuminator less sensitive to defocusing of the obturator relatively to the object focal plane of the homogenizing system, and thereby facilitate manufacturing and adjustment of the illuminator.

Advantageously, the aperture diameter of a diaphragm is of the order of magnitude of a microlens. For example, a microlens may have a diameter of the order of 0.5 mm, and an aperture diameter may be of the order of 0.1 mm.

The correction of the diffraction resulting from the presence of the obturator by the network of aperture diaphragms depends on certain parameters of the illuminator. Notably, the sharpness of the image depends on the coherence factor of the illumination of the diaphragm network.

With reference to FIG. 4, the image of an edge of a slot of the obturator in the image focal plane of the condenser is shown, for different coherence factors. In the figure:
  the curve plotted for a "coherent" beam corresponds to a coherence factor of zero,
  the curve plotted for a "partly coherent" beam corresponds to a coherence factor of 0.3, and
  the curve plotted for an "incoherent" beam corresponds to a coherence factor equal to 1.

A geometrical position in millimeters with respect to the slot is given in abscissae. The slot is positioned at 25 mm, the transparent portion of the slot being found at less than 25 mm, and the opaque portion being found after 25 mm.

The light intensity is illustrated in ordinates as a percentage of the intensity of the incident beam. Theoretically, this intensity is equal to 100% in the transparent portion of the slot and falls to 0% in the opaque portion.

Now, for a totally coherent beam, interference patterns appear on the transparent side of the slot, giving the sinusoidal appearance of the intensity at this level.

These interferences disappear in the case when the beam is totally incoherent, this improvement however occurring to the detriment of the transition between the opaque portion and the transparent portion of the slot at 25 mm.

The case when the beam is partly coherent is an intermediate case, providing a good compromise between both previous cases. More specifically, an advantageous configuration is ensured when the beam has a coherence factor comprised between 0.2 and 0.8.

The coherence factor is written as $$\sigma = \frac{2f_1 \sin(\theta)}{b},$$

wherein $f_1$ is the focal length of the array of microlenses L3 of the homogenizing system, $\theta$ is the illumination angle of the obturator with respect to the optical axis, and b the aperture diameter of the diaphragms. Thus the value of the coherence factor is obtained by adjusting the values of these three parameters.

However it is observed in FIG. 4 that light intensity oscillations subsist in the transparent portion of the slot. In order to average out these oscillations, provision is advantageously made for varying the aperture diameters of the diaphragms, modifying the coherence factor by doing this. Preferably, the diameters of the diaphragms vary, including between two adjacent diaphragms.

The variations of the aperture diameters from one diaphragm to another are comprised between 0 and 50%, and preferably between 0 and 30%.

Further, the aperture diameters of the diaphragms advantageously follow a random statistical distribution and this regardless of the illumination of the obturator. This allows averaging out of the diffraction phenomena, for example even locally for a given sub-beam 100.

The invention claimed is:

1. A photolithographic device illuminator, comprising:
a source (1') of a light beam,
a condenser (5),
an optical homogenizing system (4), comprising at least one array of microlenses (L3, L4), said system being positioned upstream from the condenser,
an obturator (3), positioned at the object focus of the optical homogenizing system, and
the illuminator being characterized in that it further includes a network of aperture diaphragms (8), positioned in the plane of the Fourier transform of the plane of the obturator (3).

2. The illuminator according to claim 1, wherein the network of aperture diaphragms (8) includes a plurality of diaphragms positioned facing the microlenses of an array (L3, L4) of the optical homogenizing system (4), each diaphragm of the diaphragm network being positioned facing a corresponding microlens.

3. The illuminator according to claim 1, wherein the focal distance $f_1$ of a first array of microlenses (L3) of the optical homogenizing system (4) with respect to the optical axis, the illumination angle $\theta$ of the obturator, and the aperture diameter b of the diaphragms are adapted so that the light rays passing through the diaphragms have a coherence factor $$\sigma = \frac{2f_1 \sin(\theta)}{b}$$

comprised between 0.2 and 0.8.

4. The illuminator according to claim 3, wherein the aperture diameters of the diaphragms and the coherence factors of the light rays passing through said diaphragms vary from one diaphragm to the other.

5. The illuminator according to claim 4, wherein the aperture diameters of the diaphragms and the coherence factors of the light rays are variable between two adjacent diaphragms.

6. The illuminator according to claim 4, wherein the distribution of the aperture diameters of the diaphragm is random.

7. The illuminator according to claim 4, wherein the variations of the aperture diameters from one diaphragm to the other are comprised between 0 and 50%, and preferably between 0 and 30%.

8. The illuminator according to claim 1, wherein the image focal plane of the optical homogenizing system (4) is positioned in the object focal plane of the condenser (5).

9. A photolithographic device, including a mask (7) and an illuminator according to claim 1, wherein the obturator (3) of the illuminator is positioned in a conjugate plane of the image focal plane of the condenser (5) of the illuminator.

* * * * *